United States Patent
Pavao-Moreira et al.

(10) Patent No.: US 10,250,213 B2
(45) Date of Patent: Apr. 2, 2019

(54) INTEGRATED CALIBRATION CIRCUIT AND A METHOD FOR CALIBRATION OF A FILTER CIRCUIT

(71) Applicants: Cristian Pavao-Moreira, Frouzins (FR); Olivier Doare, Mid Pyrenees (FR); Birama Goumballa, Larra (FR)

(72) Inventors: Cristian Pavao-Moreira, Frouzins (FR); Olivier Doare, Mid Pyrenees (FR); Birama Goumballa, Larra (FR)

(73) Assignee: NXP USA, Inx., Austin, TX (US)

( * ) Notice: Subject to any disclaimer, the term of this patent is extended or adjusted under 35 U.S.C. 154(b) by 440 days.

(21) Appl. No.: 15/022,239

(22) PCT Filed: Sep. 27, 2013

(86) PCT No.: PCT/IB2013/002409
§ 371 (c)(1),
(2) Date: Mar. 16, 2016

(87) PCT Pub. No.: WO2015/044703
PCT Pub. Date: Apr. 2, 2015

(65) Prior Publication Data
US 2016/0233846 A1  Aug. 11, 2016

(51) Int. Cl.
*H03H 7/01* (2006.01)
*H03H 7/12* (2006.01)
*G01S 7/03* (2006.01)

(52) U.S. Cl.
CPC .......... *H03H 7/0161* (2013.01); *G01S 7/032* (2013.01); *H03H 7/12* (2013.01);
(Continued)

(58) Field of Classification Search
CPC ............ H03H 11/1291; H03H 7/0153; H03H 21/0067; H03H 2210/04; H03H 17/0294;
(Continued)

(56) References Cited

U.S. PATENT DOCUMENTS

| 7,050,781 B2 | 5/2006 | Khalil et al. |
| 7,345,490 B2 | 3/2008 | Ibrahim et al. |

(Continued)

FOREIGN PATENT DOCUMENTS

GB  2 170 969 A  8/1986

OTHER PUBLICATIONS

International Search Report for application PCT/IB2013/002409 (dated Jun. 24, 2014).
(Continued)

*Primary Examiner* — Olumide Ajibade Akonai
(74) *Attorney, Agent, or Firm* — Charlene R. Jacobsen (57) ABSTRACT

A calibration circuit and a method for calibrating a RC circuit, such as a high-pass filter, of an integrated circuit are provided. The calibration circuit comprises a filter arrangement having tuneable filter for filtering an input signal having a predetermined frequency. The filter comprises tuneable resistor elements, a saturation detector for detecting saturation and non-saturation of the tuneable filter by comparing a comparison voltage with the signal voltage of the filtered input signal, calibration control logic for providing incrementing and decrementing counter signals. The calibration circuit sets the comparison voltage to a first threshold voltage provides iteratively the incrementing counter signal to the filter until saturation is detected reduces the comparison voltage to a predetermined second threshold voltage after saturation is detected, the second threshold voltage being a lower value than the first threshold voltage, and provides the decrementing counter signal to the filter until non-saturation is detected.

20 Claims, 9 Drawing Sheets

(52) U.S. Cl.
CPC . *H03H 2210/028* (2013.01); *H03H 2210/036* (2013.01); *H03H 2210/04* (2013.01); *H03H 2210/043* (2013.01)

(58) Field of Classification Search
CPC ............ H03H 17/04; H03H 1/02; H03H 7/03; H03H 7/25; H03H 2210/028; H03H 2210/036; H03H 7/0161; H03H 7/12; H03B 5/20; H03B 1/30; H03J 2200/08; H03J 2200/10; H03J 2200/29; G01S 7/032; H02J 7/0081; H04B 1/30
See application file for complete search history.

(56) References Cited

U.S. PATENT DOCUMENTS

| | | | |
|---|---|---|---|
| 7,911,181 B2 | 3/2011 | Raidl et al. | |
| 2002/0067220 A1* | 6/2002 | Horng | C07C 67/28 333/17.1 |
| 2003/0216129 A1* | 11/2003 | Khalil | H04B 1/28 455/197.2 |
| 2004/0169565 A1 | 9/2004 | Gaggl et al. | |
| 2009/0108858 A1* | 4/2009 | Kao | H03H 7/0161 324/750.01 |
| 2011/0279175 A1* | 11/2011 | Kuo | H03H 11/12 327/553 |

OTHER PUBLICATIONS

Lee, Jri et al; "A fully-Integrated 77-GHz FMCW Radar Transceiver in 65-nm CMOS Technology"; IEEE Journal of Solid-State Circuits, vol. 45, No. 12; pp. 2746-2756 (Dec. 2010).

Mitomo, Toshiya et al; "A 77 GHz nm CMOS Transceiver for FMCW Radar Applications"; IEEE Journal of Solid-State Circuits, vol. 45, No. 4; pp. 928-937 (Apr. 2010).

Trotta, Saverio, et al; "An RCP Packaged Transceiver Chipset for Automotive LRR and SRR Systems in SiGe BiCMOS Technology"; IEEE Transactions on Microwave Theory and Techniques, vol. 60, No. 3; pp. 778-794 (Mar. 2012).

* cited by examiner

INTEGRATED CALIBRATION CIRCUIT AND A METHOD FOR CALIBRATION OF A FILTER CIRCUIT

FIELD OF THE INVENTION

This invention relates to a calibration circuit and a method for calibration of a filter circuit. The invention also relates to an integrated circuit, in particular a receiver circuit, and a radar system.

BACKGROUND OF THE INVENTION

Common technologies for producing integrated circuits are the so-called Complementary Metal Oxide Semiconductor (CMOS) and Bipolar Complementary Metal Oxide Semiconductor (BiCMOS). CMOS and/or BiCMOS technologies have become the fabrication technologies of choice for a majority of integrated circuits, such as automotive, cellular and wireless applications, due to its flexibility of design, level of integration and manufacturing costs. With (Bi)CMOS technology, however, there are also some limitations such as component tolerances. For example, component tolerances of on-chip passive integrated resistors and capacitors are typically in the range of +/−5% (best case), but more typically in the range of +/−30%. These component tolerances are especially relevant for precision circuits such as RC circuits.

A tolerance sensitive application is for example an automotive radar system. Such radar systems consist of a transmitter (TX) chip having an integrated phase-locked loop (PLL), power amplifiers and a local oscillator output along with one or several multi-channel receivers (RX) that provide the low-noise down-conversion of the high frequency radar signals into an intermediate frequency (IF). These radar systems are, for example, used for blind spot detection, objection detection, stop and go and adaptive cruise control applications. The present invention and the underlying problem will hereinafter be described on the basis of an automotive radar system, however, without restricting the invention to this sort of application.

The receivers within the radar systems typically comprise some chains of high-pass (HP) filters. Traditional HP-filter topologies employ RC-based filters having capacitor (C) and resistor (R) elements. In (Bi)CMOS technology, as already stated above, the C and R elements exhibit high spread in process variation which consequently have an impact on filter properties, such as its the cutoff frequency. Radar applications are sensitive to variations of the high-pass filter cutoff frequency. The cutoff frequency (or corner frequency) is the frequency either above or below which the power output of a circuit, such as an amplifier or an electronic filter, has fallen to a given amplitude. If, for example, the cutoff frequency is lower than expected, the receiver circuit will provide a lower attenuation of low frequency blockers which could be interpreted as erroneous targets at application level. If, on the other hand, the cutoff frequency is higher than expected, the receiver will provide a higher attenuation of useful signals. Consequently, higher in-band gain-ripples will occur.

In order to reduce the adverse effects of component tolerance variations, those (Bi)CMOS based receiver circuits employ RC calibration circuits. Those calibration circuits allow achieving a required filter response with well-controlled cut-off frequency regardless of the process spread on the R and C elements.

U.S. Pat. No. 7,345,490 D2 discloses a known approach for filter calibration. Here, a RSSI (Receive Signal Strength Indicator) is used to first measure the signal strength when the filter is in its bandpass using a first input frequency. Then, a given filter element, for example the R element or C element, is changed and a second input frequency is applied. Then, the signal strength is measured up to the required level, for example the desired attenuation value. Since the calibration circuit disclosed in U.S. Pat. No. 7,345,490 B2 employs a calibration loop and further needs an external pin to inject the calibration signal at the right frequency, this solution is not applicable in so-called stand-alone receivers.

Hence, there is a need to find a simpler, more reliable possibility to correct RC filter parameters for desired filter attenuations, which in particular is applicable in stand-alone receivers.

SUMMARY OF THE INVENTION

The present invention provides an integrated calibration circuit for calibration of a filter circuit, a method for calibration of a filter circuit, an integrated circuit, in particular a receiver circuit, and an automotive radar system.

Specifically, according to a first aspect of the invention, a calibration circuit for calibrating a RC circuit of an integrated circuit, in particular for calibrating a high-pass filter, is provided wherein the calibration circuit comprising: a filter arrangement comprising at least one tuneable filter configured to filter an input signal having a predetermined frequency wherein the filter comprises at least two tuneable resistor elements; a saturation detector configured to detect saturation and non-saturation of the tuneable filter by comparing a comparison voltage with the signal voltage of the filtered input signal; a calibration control logic configured to provide an incrementing counter signal and a decrementing counter signal; wherein the calibration circuit is further configured to set the comparison voltage to a first threshold voltage; to provide iteratively an incrementing counter signal (which means that the input signal amplitude is increasing) to the filter until saturation is detected; to after saturation is detected, reducing the comparison voltage to a predetermined second threshold voltage which is a predetermined value lower than the first threshold voltage; to provide then iteratively a decrementing counter signal (which means that the input signal amplitude is decreasing) to the filter until non-saturation is detected.

According to a second aspect of the invention, an integrated circuit, in particular a stand-alone receiver circuit, is provided, the integrated circuit comprising: a frequency mixer configured to shift an input signal from a high frequency range to an intermediate frequency range; a baseband circuit arranged downstream to the high frequency mixer and comprising at least one filter stage and at least one calibration circuit according to the first aspect of the present invention, wherein the calibration circuit employs at least one filter stage of the baseband circuit for calibration.

Further, according to a third aspect of the invention, an automotive radar system is provided, comprising a transmitter circuit for transmitting signals, a frequency synthesizer circuit for providing a desired operating frequency, a microcontroller circuit and a receiver circuit according to the second aspect of the present invention.

Finally, according to a fourth aspect of the invention, a built in self-test calibration method for calibrating a filter arrangement having a tuneable filter is provided, in particular by employing a calibration circuit according to the first aspect, the method comprising: Setting a comparison voltage at a saturation detection device to a first threshold voltage; Providing an input signal having a predetermined frequency to the tuneable filter; Iteratively providing an incrementing counter signal to a first tuneable resistor element of the tuneable filter until saturation is detected; Storing the actual incrementing counter value for which saturation was detected; Setting the comparison voltage to a predetermined second threshold voltage; Iteratively providing a decrementing counter signal to a second tuneable resistor element of the tuneable filter circuit until non-saturation is reached; Storing the actual decrementing counter value for which non-saturation was detected.

A first idea underlying the present invention is to provide a built-in self-test (BIST) calibration circuit and a calibration method which, by means of relative measurement, find the correct resistor value inside a RC circuit of a filter arrangement in order to provide the required filter output frequency response. After incrementing/decrementing resistor values of the RC circuit and tracking saturation levels, a given attenuation, such as a −3 dB or −6 dB attenuation, at a given input frequency can be produced. This is achieved by a saturation detector which operates as a programmable threshold voltage comparator and an up and down counter for incrementing and decrementing resistor values. This calibration circuit does not operate with external calibration signals and therefore does not need a calibration input terminal for receiving an externally generated calibration signal. This avoids the use of a calibration loop back and the calibration circuit may be implemented in stand-alone integrated circuits, such as stand-alone receivers.

A second basic idea of the present invention is the use of already present circuit components for executing the calibration, such as filter circuits and a saturation detector. This allows that components which are already present within the integrated circuit under test can be re-used for implementing the calibration. There is only the need to add an additional low-resolution digital to analogue converter (DAC) for providing a desired calibration input signal (i.e. predetermined frequency and amplitude) and a simple calibration control logic for controlling the calibration process. Since the calibration is done without using external circuit elements, this reduces the calibration time significantly. Further, it allows the use of small RC components, such as small high resistivity resistors, which typically have a very high spread, but which are cost-attractive in terms of chip area reduction.

Additionally, such calibration blocks are used only during the calibration made, with no drawbacks on overall circuit current consumption in the normal operating mode, where the calibration is off.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

In all figures of the drawings elements, features and signals which are the same or at least have the same functionality have been provided with the same reference symbols, unless explicitly stated otherwise.

DETAILED DESCRIPTION OF THE EMBODIMENTS

Figure 1:
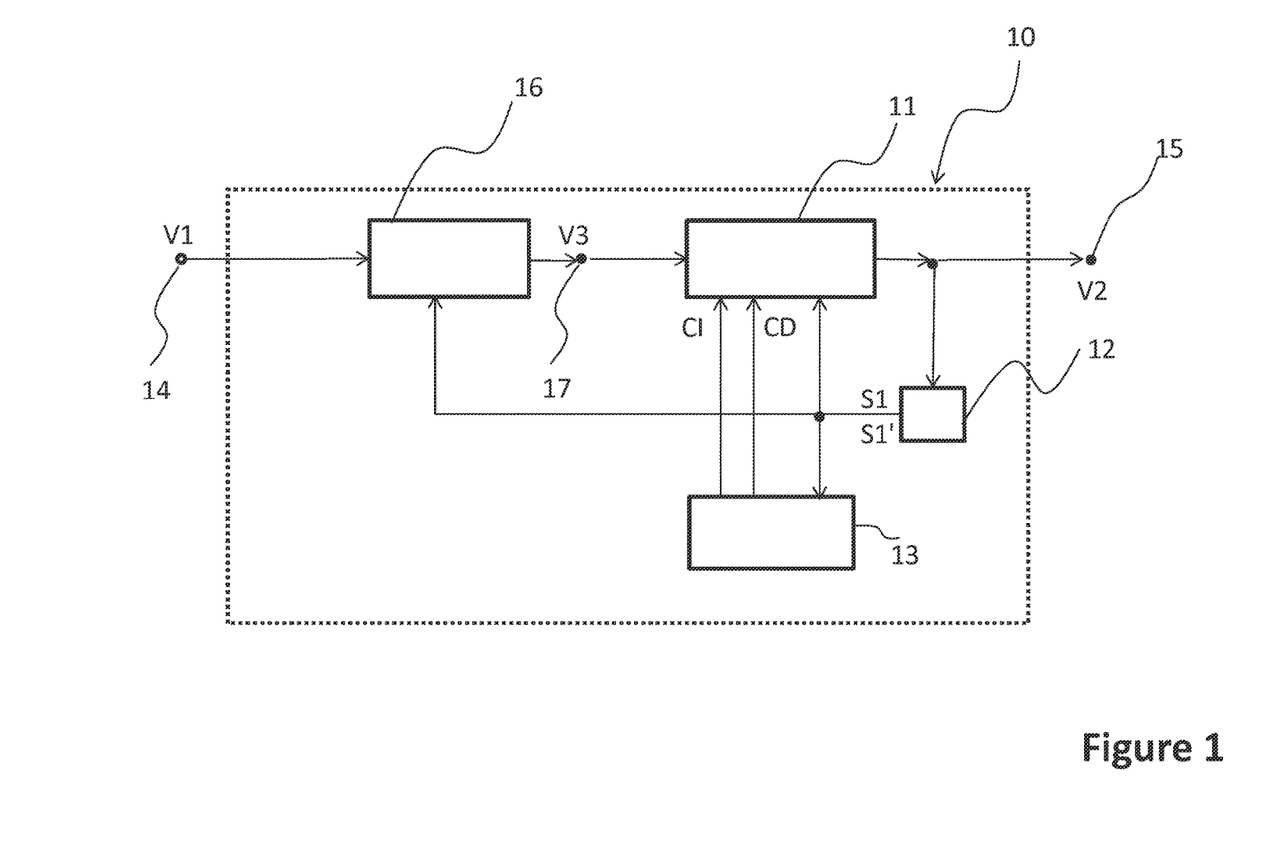
FIG. 1 shows a block diagram of an integrated calibration circuit according to an aspect of the present invention.

FIG. 1 shows a block diagram of an integrated calibration circuit according to a first aspect of the present invention. The calibration circuit which is denoted by reference symbol 10 is configured to calibrate the RC components of a filter circuit. The calibration circuit 10 comprises a chain of two filter circuits 11, 16, a saturation detector 12 and a calibration control logic 13.

In the embodiment of FIG. 1, the filter circuits 11, 16 are high-pass (HP) filters which are arranged in a signal path between an internal calibration input terminal 14 and an output terminal 15. A tap 17 having a tap voltage V3 is provided between the output side of the first HP filter 16 and the input side of the second HP filter 11.

A HP filter is an electronic device that let high frequency signals pass. HP-filter attenuate (which means reduces the amplitude of) signals with frequencies lower than the so-called cutoff frequency. The actual amount of attenuation for each frequency varies from filter to filter.

The calibration input terminal 14 is designed to receive a calibration signal V1 having a predetermined frequency. The generation of this calibration signal having the predetermined frequency will be described in more detail later.

The HP filters 11, 16 are configured to filter the calibration signal V1 and to provide at an output side of the second HP filter 11 a filtered output signal V2 which is tapable at the output terminal 15. The saturation detector 12 is tapping the output signal V2 and is further configured to detect saturation and non-saturation of the filter arrangement 11, 16 by comparing the output signal V2 with a comparing voltage reference (or threshold). The saturation detector 12 is further generating saturation status signals S1, S1' for controlling operation of the HP filters 11, 16 and the calibration control logic 13. The saturation status signals S1, S1' are in the present embodiment binary signals which are complementary to each other, i.e. if S1=1 (or ON) then S1'=0 (or OFF) or if S1=0 then S1'=1.

The calibration control logic 13 is arranged at an output side of the saturation detector 12. The calibration control logic 13 is configured to trigger the second HP filter 11, based on the saturation status signal S1, with an incrementing counter signal CI and a decrementing counter signal CD.

Figure 2:
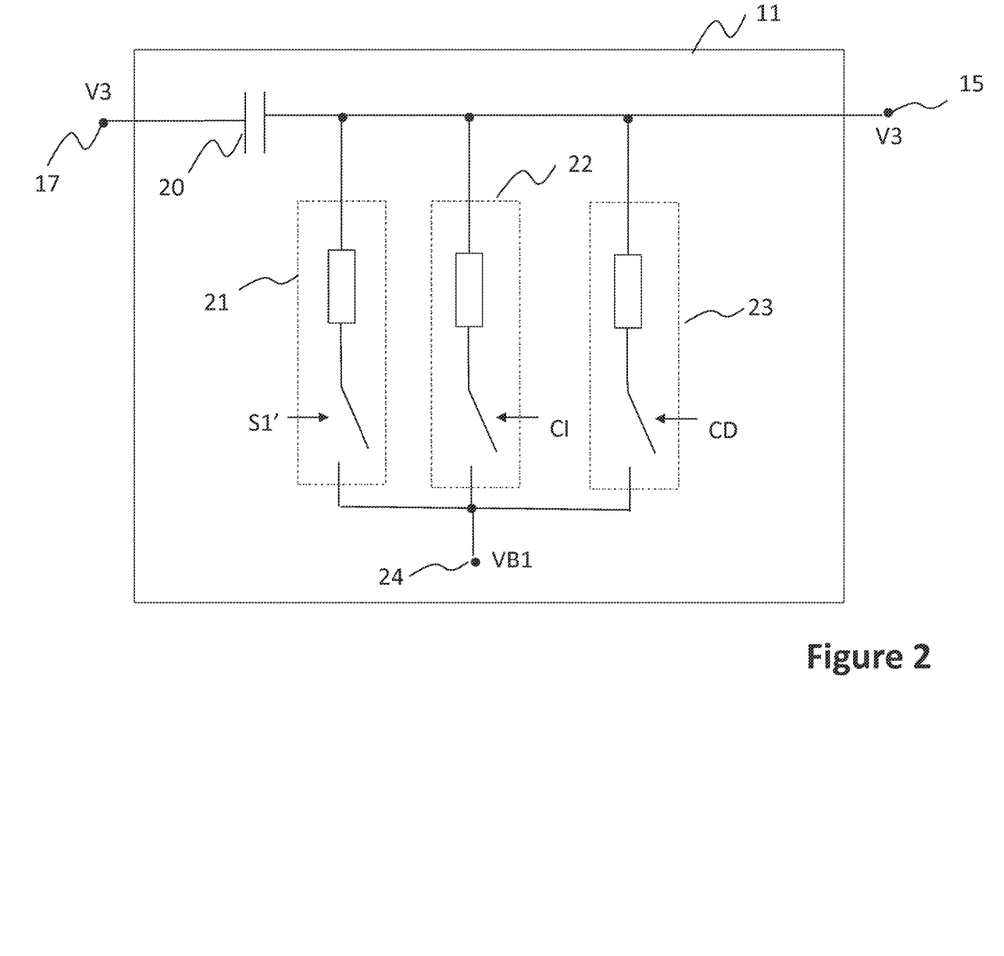
FIG. 2 schematically shows an embodiment of the second high-pass filter of the calibration circuit of FIG. 1.

FIG. 2 shows an embodiment of the second HP filter 11 of the calibration circuit 10 of FIG. 1. In this embodiment the HP filter 11 is a first order, passive high-pass filter consisting of an RC circuit. The HP filter 11 comprises a capacitor element 20 arranged between the tap 17 and the output terminal 15. The R part of the RC circuit is, in the embodiment shown in FIG. 2, consisting of three binary weighted switchable resistor elements 21, 22, 23 arranged in parallel to each other. The parallel arrangement of the resistor elements 21-23 is further arranged between a reference terminal 24 having a reference voltage VB1 and the output terminal 15. The HP filter 11 is tuneable such that resistor values settable to a desired value.

Each of the switchable resistor elements 21-23 comprises a resistor or a resistor network and controllable switches. The resistor element 21 comprises a resistor and a controllable switch arranged in series to the resistor. The switch is controllable via the saturation status signal S1'. The resistor elements 22, 23 comprise resistor array or a switchable resistor network, preferably in the form of a switchable series-connection of a plurality of resistors each having the same resistor value and which are connectable one after the other by using a trigger signal (binary weighted control). For that matter, the resistor element 22 is triggered by the incrementing signal CI and the resistor element 23 is triggered by the decrementing signal CD. This way, the values of the resistor elements 22, 23 and thus the filter transfer function of the HP filter 11 are tuneable via the corresponding incrementing and decrementing counter signals CI, CD.

Figure 3:
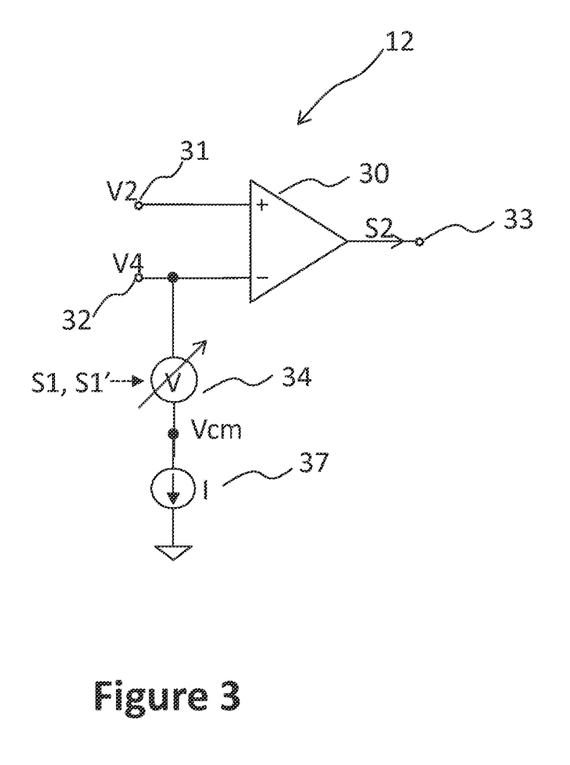
FIG. 3 schematically shows an embodiment of the saturation detector of the calibration circuit of FIG. 1.

FIG. 3 schematically shows an embodiment of the saturation detector 12 of the calibration circuit of FIG. 1. The saturation detector 12 comprises an analogue comparator 30, such as an operational amplifier 30. The comparator 30 has two analog input terminals 31, 32 and one binary digital output terminal 33. The comparator 30 receives on its positive input terminal 31 the output voltage V2 of the second HP filter 11. The comparator 30 receives on its negative input terminal 32 a comparison voltage V4. The comparator 30 is configured to compare the output voltage V2 with the comparison voltage V4 and to provide at the output terminal 33 a comparator output signal S2. If, e.g. the two voltages V2, V4 are equal, then the comparator 30 switches the saturation status signal S2 from "0" to "1" or vice versa. This signal S2 is used for deriving the saturation status signals S1, S1'.

The saturation detector 12 further comprises an adjustable voltage generator 34 which is configured and controlled such to provide a desired comparison voltage V4 to the negative input terminal 32 of the comparator 30. With the adjustable voltage generator 34 it is possible to set a user defined comparison voltage V4. For example, the voltage generator 34 is configured to set a comparison voltages V4=Vth and V4=Vth/2 for an overall −6 dB attenuation at the baseband output of the HP filter circuit. As a matter of course, also other comparison voltages V4 for other attenuations are possible.

Figure 3A:
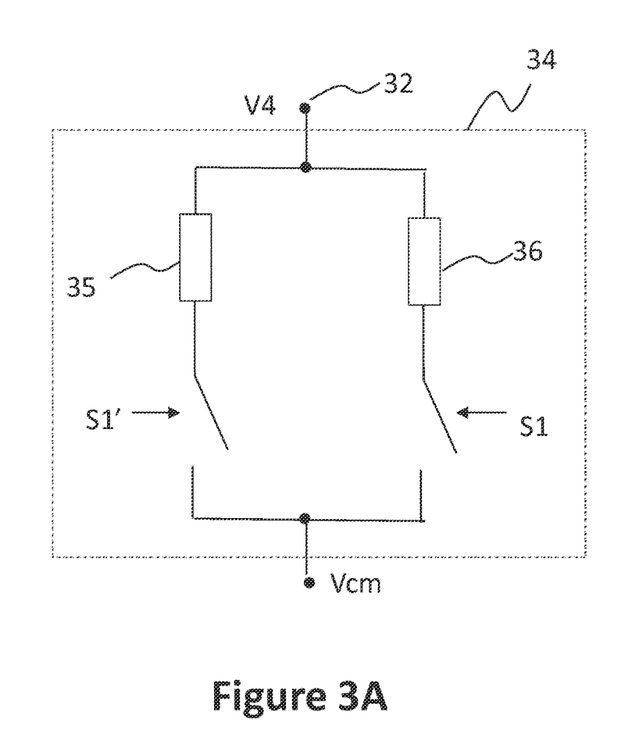
FIG. 3A shows an embodiment of the voltage generator used for the saturation detector in FIG. 3.

In the embodiment shown in FIG. 3A, the voltage generator 34 consists of two switchable resistor elements 35, 36 arranged in parallel to each other. Each of the resistor elements 35, 36 is consisting of a resistor and a controllable switch in series connection. The switches are controlled via complementary control signals, such as the saturation status signals S1, S1'. In order to set different resistor values, the values of the resistor elements 35, 36 are different. In particular, for providing the comparison voltages V4=Vth (up to saturation is detected) and V4=Vth/2 (after saturation is detected) for an overall −6 dB attenuation, the resistor value of the resistor 36 is half of the resistor value of the resistor 35.

The voltage generator 34 is connected between the terminal 32 and a constant current source 37 connected to a given input common mode voltage Vcm such that in operation a first threshold voltage Vth is present on input terminal 32 if the resistor element 35 is switched on. This first threshold voltage Vth accounts for input common mode voltage Vcm ie, the threshold to saturation to be detected is the input common mode voltage Cm plus a settable Vth level (V4=Vcm+Vth). If resistor element 35 is switched off and resistor element 36 is switched on then the comparison voltage V4 over resistor 36 is half of the threshold voltage Vth over resistor 35.

Figure 4:
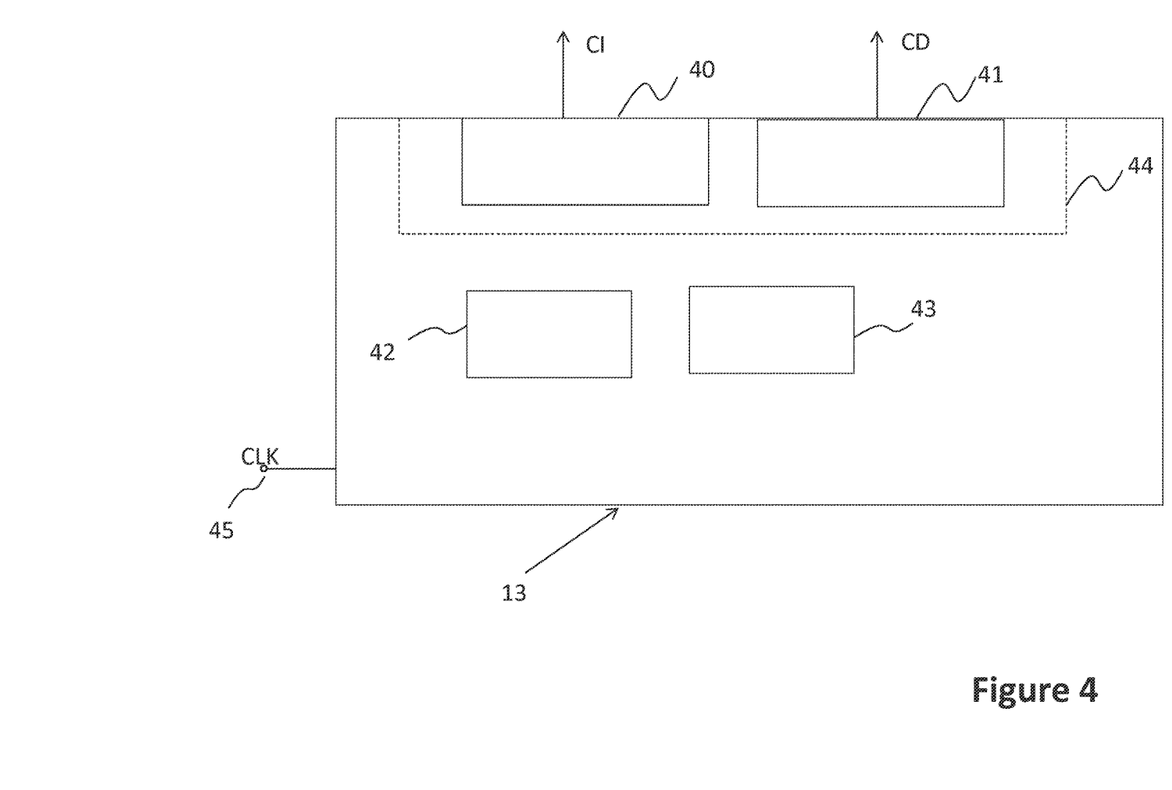
FIG. 4 schematically shows an embodiment of the calibration control circuit of the calibration circuit of FIG. 1.

FIG. 4 schematically shows an embodiment of the calibration control circuit 13 of the calibration circuit of FIG. 1. The calibration control logic 13 comprises a first counter 40, a second counter 41, a timer unit 42, a memory unit 43 and a clock input terminal 45. The calibration control logic receives 13 at the clock input terminal 45 a clock signal CLK, which for example is the system clock or derived from it.

The counters 40, 41 as well as the timer 42 are triggered by the clock signal CLK. The first counter 40 is an incrementing counter and the second counter 41 is a decrementing counter. Triggered by the clock signal CLK and controlled by the timer 42, the incrementing counter 40 generates the incrementing counter signal CI. The same way, the decrementing counter 41 generates a decrementing counter signal CD. It may also be possible that the functionality of the both counters 40, 41 is implemented in one single counter which for example is an up/down counter 44 (shown in dotted lines) which counts both up and down, under command of a control input.

Figure 5:
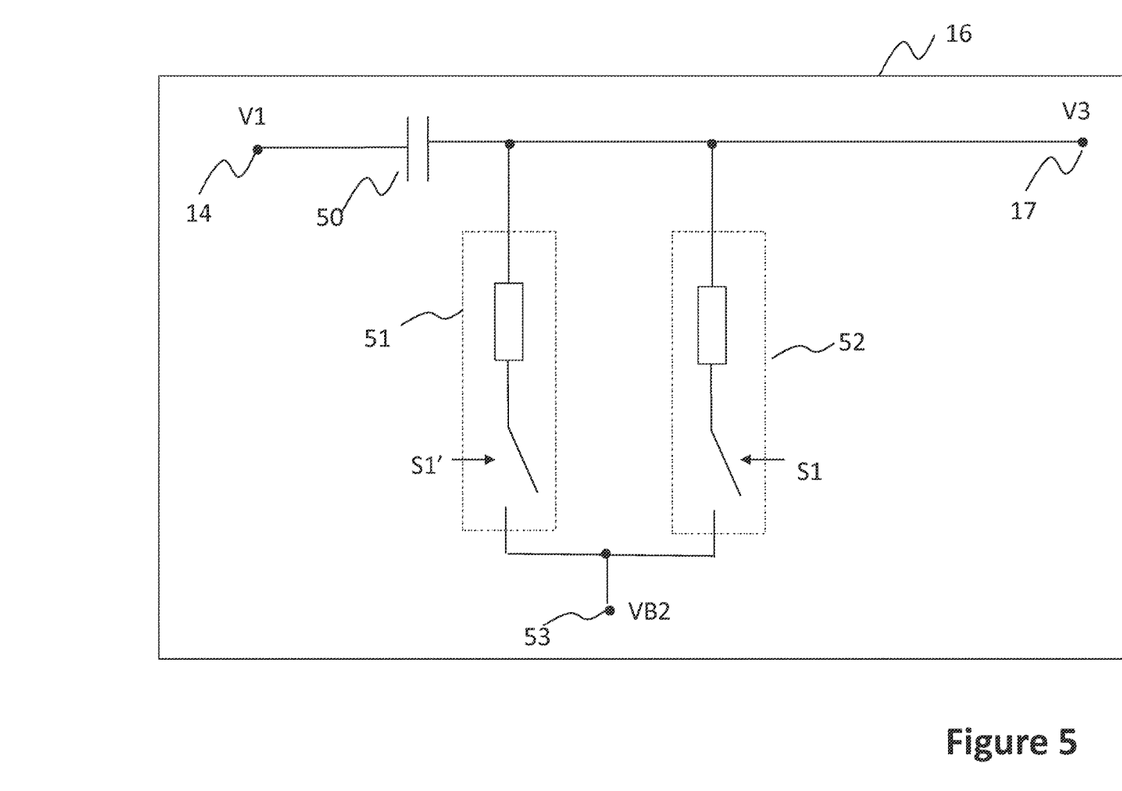
FIG. 5 schematically shows an embodiment of the first high-pass filter of the calibration circuit of FIG. 1.

FIG. 5 shows an embodiment of the first HP filter 16 of the calibration circuit 10 of FIG. 1. The HP filter 16 is a first order, passive high-pass filter consisting of an RC circuit. The HP filter 11 comprises a capacitor element 50 arranged between the input terminal 14 and the tap 17. The R part of the RC circuit consists of two switchable resistor elements 51, 52 arranged in parallel to each other. The parallel arrangement of the resistor elements 51, 52 is further arranged between a reference terminal 53 having a reference voltage VB2 and the tap 17. Each of the switchable resistor elements 51, 52 comprise a resistor and controllable switch arranged in series to the corresponding resistor. The resistor element 51 is controllable by the complementary saturation status signal S1' and the resistor element 52 is controllable by the saturation status signal S1. Resistor element 51 has a very high resistor value and may be effectively used to "bypass" the HP filter 16 (no attenuation at input frequency to calibrate). Resistor element 51 is only needed for calibration purpose, and connected up to a saturation is detected (counter increasing). Resistor element 52 is the HP filter's 16 'main' resistor used to provide the HP function of the RC member at around the HP filter 16 cut-off frequency. It is connected only after the saturation is detected (counter decreasing). This way, always only one of the resistor elements 51, 52 is connected, depending on the calibration phase or state.

Unlike the second HP filter 11, the first HP filter 16 is not tuneable. However, the first HP filter 16 comprises a switchable bypass in order to bypass the first HP filter 16 during a first phase of calibration, i.e. up to saturation is detected.

In this first phase, the counter is incrementing, meaning the input amplitude of injected calibration signal is increasing).

Figure 6A:
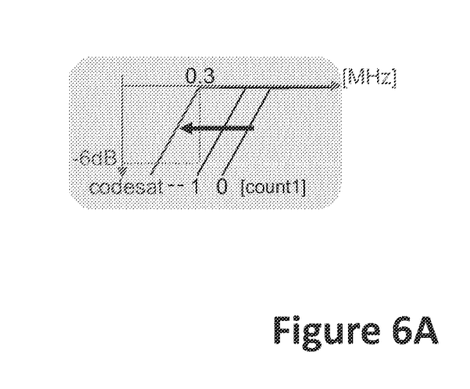
FIGS. 6A-6C show frequency transfer functions to illustrate a method of calibration according to an aspect of the present invention.
Figure 6B:
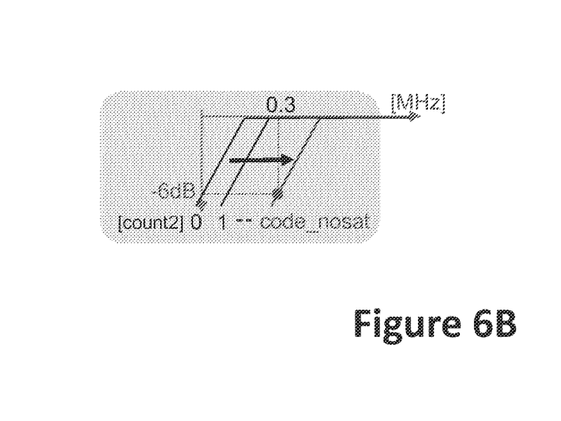
Figure 6C:
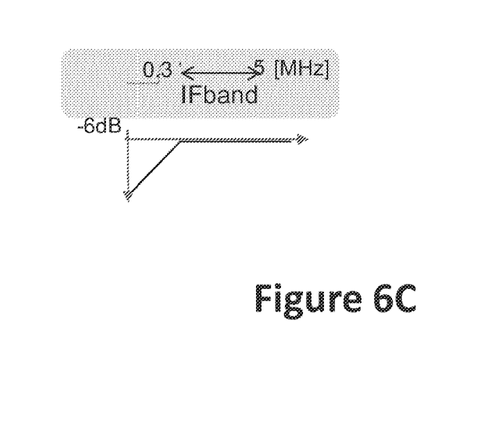

Hereinafter, the functionality of the calibration circuit 10 as shown in FIGS. 1-5 will be described in detail by means of the frequency transfer functions illustrated in FIGS. 6A-6C.

As a starting point, an input signal V1 having a fixed input amplitude and a predefined frequency, for example 300 kHz, is applied to input terminal 14. Further, a given comparison voltage V4=Vth is applied to the negative input terminal 32 of the comparator 30. The saturation control signals S1, S1' are initially set to S1=0 and S1'=1 such that the resistor elements 21, 35, 51 which are triggered by the saturation control signal S1' are closed and the resistor elements 36, 52 which are triggered (i.e. closed) by the complementary saturation control signal S1 are opened. Finally, the counter values CI, CD of the incrementing and decrementing counter 40, 41 are reset, i.e. set to zero.

As a first step, the first HP filter 16 is bypassed, e.g. by switching ON the resistor element 51 and switching OFF the main resistor element 52. Thus, the second HP filter 11 is then operated (more or less) with the input voltage V1=V3.

The saturation detector 12 is iteratively comparing the output voltage V2 of the HP filter 11 with the comparison voltage V4=Vth. After each of these iteration steps, where the comparator 30 is comparing the voltages V2, V4, the incrementing counter 40 increments its counter value which is used for triggering the resistor element 22, thereby incrementing the resistor value. Consequently, the output voltage V2 of the high-pass filter 11 increases steadily. If the output voltage V2 is such that V2=V4, saturation is achieved. This is detected by the comparator 30 of the saturation detector 12. In this case, the iterations are stopped by stopping the counter 40 incrementing its counter value. The actual counter value of the counter 40, at which saturation is detected, is analysed and stored in the memory 43. This counter value of the counter 40 is clamped to the switchable resistor 22.

By incrementing the counter value from zero to the counter value 'codeSat', for which the comparator 30 has detected the saturation event, this counter value 'codeSat' denotes to the applied frequency of 300 kHz of the input voltage signal. By incrementing the counter value and thus the resistor value, the filter transfer function of the high-pass filter is moved to the left side, thereby increasing the effective amplitude at 300 kHz. This is illustrated in the frequency transfer function in FIG. 6A.

After saturation is detected, the first HP filter 16 is plugged to the second HP filter 11. When saturation is detected, the saturation detector 12 changes it output signal S1 from low or "0" to high or "1". Consequently, S1' is changed from "1" to "0". Since resistor element 35 of comparator 30 is switched off and resistor element 36 is switched on, a comparison voltage V4=Vth/2 is applied to the input terminal 32.

By changing the settings as described above, in the next step, the counter value of counter 41 is decreased iteratively. Resistor element 23 is then triggered by the decrementing counter signal CD. This has the effect that the output voltage V2 is decreasing steadily: Again, the saturation detector 12 is comparing this output voltage V2 with the reduced comparison voltage V4=Vth/2 until saturation disappears. In this scenario, the counter 41 is stopped. The actual counter value 'code_nosat' of the counter 41 is analysed and stored in the memory 43. By decrementing the counter value, the filter transfer function is actually moved from the left side to the right side and thus decreasing the effective amplitude at 300 kHz. This can be seen in FIG. 6B.

This method is based on the finding, that after having found the operation point, where the saturation event disappears, the output voltage at 300 kHz input frequency will be half its initial value, which means −6 dB below the initial value. This is exactly the operation point of the cut-off frequency which is needed to set for correct operation. Since the described method refers to a relative measurement by comparing a reference threshold voltage Vth with the output voltage of the high-pass filter 11 and then half of this reference threshold voltage Vth/2 with the output voltage of the whole filter arrangement 11, 16, no additional information about the absolute voltage levels of the input signal are needed or required. This way, the full baseband output high-pass filter cut-off frequency will be calibrated at −6 dB. This is illustrated in FIG. 6C.

Figure 7:
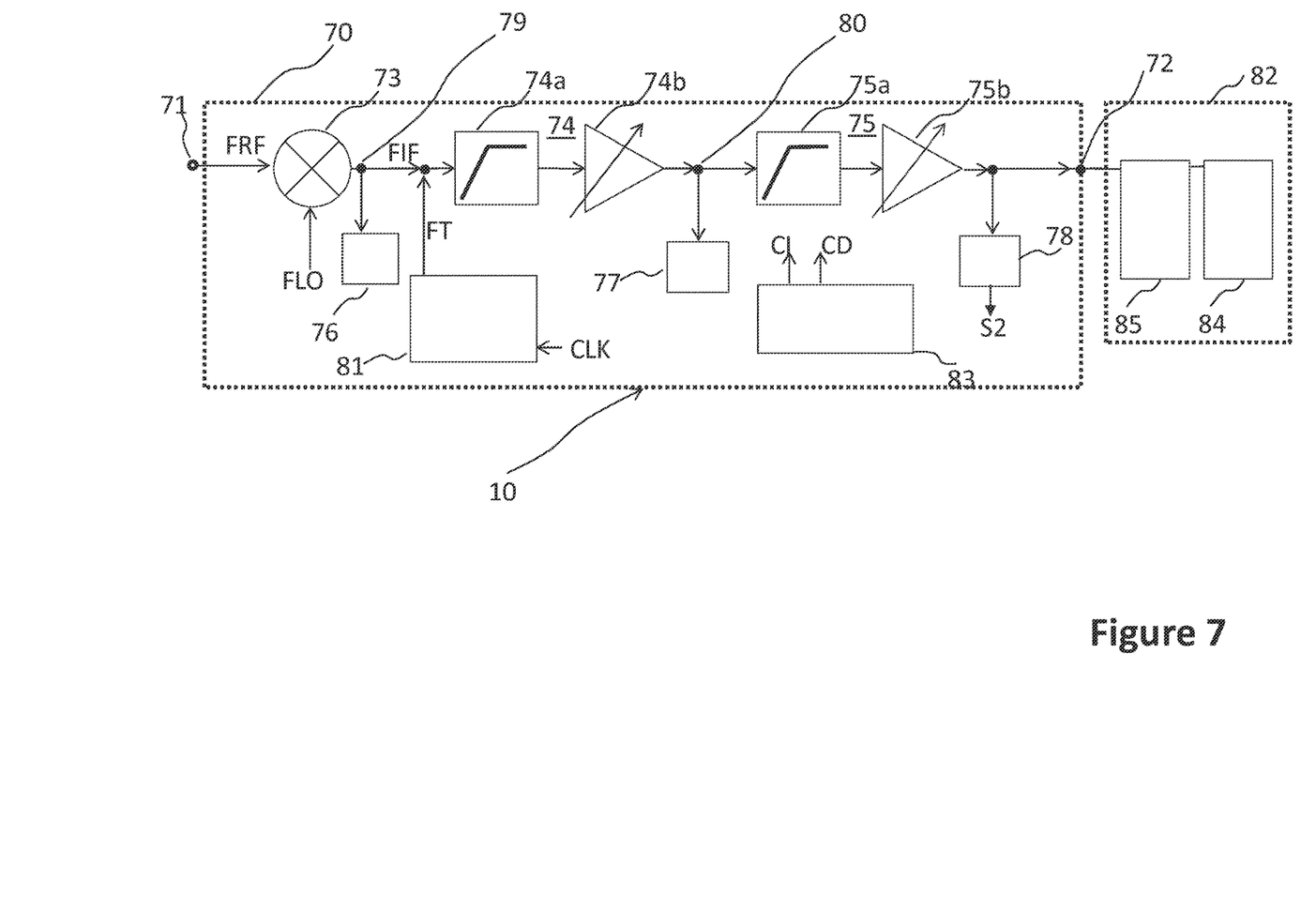
FIG. 7 shows a block diagram of an integrated circuit having a calibration circuit according to an aspect of the present invention.

FIG. 7 shows a block diagram of an integrated circuit having a calibration circuit according to an aspect of the present invention. In FIG. 7, the integrated circuit is denoted by reference symbol 70. This integrated circuit 70 may be, for example, a stand-alone receiver circuit 70 (e.g. for a radar system), a transceiver circuit or the like. The receiver circuit 70 comprises an input terminal 71 and an output terminal 72. The receiver circuit 70 comprises a high-frequency mixer 73, for example a 77 GHz mixer. The mixer 73 is connected to the input terminal 71 to receive a high-frequency input signal FRF and to a local oscillator (not shown in FIG. 7) to receive an oscillator signal FLO. This oscillator may be part of a phase-locked loop (PLL). The mixer 73 is a non-linear electric circuit that creates an output signal FIF having a new intermediate frequency which is derived from the oscillator signal and the high-frequency signal FRF.

In the embodiment shown in FIG. 7, the integrated circuit 70 further comprises a chain of high-pass filter/amplifier stages 74, 75. In the present embodiment, two high-pass filter/amplifier stages 74, 75 are shown. Each of these high-pass filter/amplifier stages 74, 75 comprises of a high-pass filter 74a, 75a and a variable gain amplifier (VGA) 74b, 75b each of them connected downstream to the corresponding high-pass filter 74a, 75a.

The high-pass filters 74a, 75a are in this example passive, analogue, first order high-pass filter which are realized by RC circuits. However, it may also be possible to use active high-pass filters employing RC circuits together with an amplifier.

The first high-pass filter 74a may have a circuitry as shown in FIG. 5. The second high-pass filter 75a may have a circuitry as shown in FIG. 2. However, it should be self-understood that also other circuit topologies of the RC based high-pass filters 74a, 75a may be possible.

The integrated circuit 70 comprises altogether three saturation detectors 76, 77, 78. The first saturation detector 76 is connected to a tap 79 between the mixer 73 and the first high-pass filter 74a. The second saturation detector is connected to a tap 80 right between the two high-pass filter/amplifier stages 74, 75. The third saturation detector 78 is connected to a tap 72 at the output side of the second high-pass filter/amplifier stage 75 which simultaneously forms the output terminal 72. This third saturation detector 78 may have a circuitry as shown in FIG. 3.

Further, the receiver circuit 70 comprises a digital-to-analogue converter (DAC) 81. The DAC 81 is designed to provide, triggered by a clock signal CLK of e.g. 50 MHz, a sinus-like signal FT of a predetermined test or calibration frequency, e.g. such as 300 kHz. This sinus-like signal FT is then provided to the input side of the first high-pass filter/amplifier stage 74. A DAC 81 with low resolution (or low number of bits) can be used to generate the sinus-like input signal at a predetermined frequency FT to calibrate. This simplification on DAC 81 is possible since the calibration method is based on a relative measurement of the input signal amplitude (Vth and Vth/2 set here to calibrate cut-off frequency at −6 dB level), as detailed above.

Finally, the receiver circuit 70 comprises a calibration control logic 84, e.g. such as the one shown in FIG. 4. The calibration control logic 84 is controlled by status control signals S1, S1' of the saturation detector 78 arranged last in the chain of saturation detectors 76, 77, 78. The same way, the calibration control logic 84 triggers the HP filter 75a arranged last in the chain of HP filter 74a, 75a.

A printed circuit board (PCB) 82 is connected downstream the receiver circuit 70. The PCB comprises, for example, a microcontroller 84, loads 85, sensing devices and the like.

In order to enable calibration of the RC-circuits of the receiver circuit 70, it comprises a calibration circuit 10 as shown in FIG. 1. According to the present invention, this calibration circuit 10 uses elements of the receiver circuit 70, such as the high-pass filter/amplifier stages 74, 75 and the saturation detectors 76, 77, 78. Only a DAC 81 and calibration control logic 83 had to be added for the functionality of the calibration circuit 70. This enables that the calibration circuit 10 be operated without external circuit resources and thus enables a stand-alone receiver circuit 70. Further, these additional blocks are used only during the calibration phase, with no drawbacks on the current consumption of the receiver circuit 70 in normal operating mode.

The implementation of a calibration circuit 10 according to the present invention is highly visible when observing and analyzing at the output frequency of any receiver circuit, such as a radar receiver. The calibration method according to the present invention improves the accuracy of the cut-off frequency. In particular, dispersion of the filter's calibrated −6 dB cut-off frequency (or any other selected and calibrated cut-off frequency) will not occur if a RC calibration method and a calibration circuit 10 according to the present invention are used.

Additionally, it should be mentioned that different desired attenuation levels other than −6 dB, such as −3 dB, etc., can be applicable using the calibration method and circuit according to the present invention. For the attenuation value, a different resistor ratio between resistor 35 and 36 and thus between the threshold voltage Vth and Vth/2 can be used to achieve different attenuations. This may be used by using settable resistors.

The same way, also different input frequencies (other than 300 kHz) may be applied to the input signal V1. Other cut-off frequencies can be set e.g. by employing a divider chain inside the DAC. This can be done by changing the division ratio of the given 50 MHz system clock, which forms the reference signal.

Figure 8:
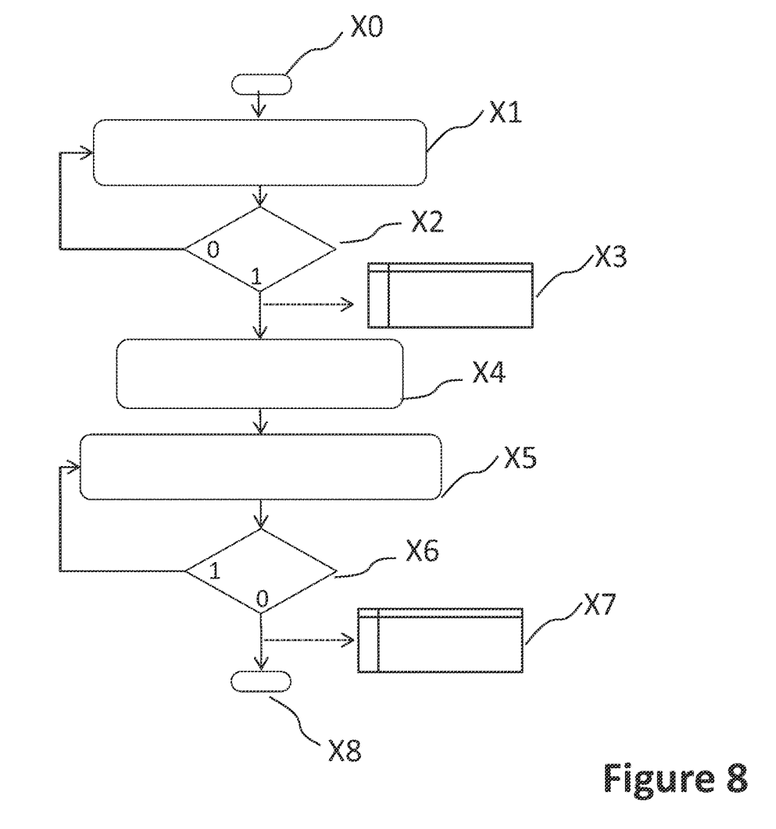
FIG. 8 shows a flow diagram illustrating the calibration method according to an aspect of the present invention.
Figure 9:
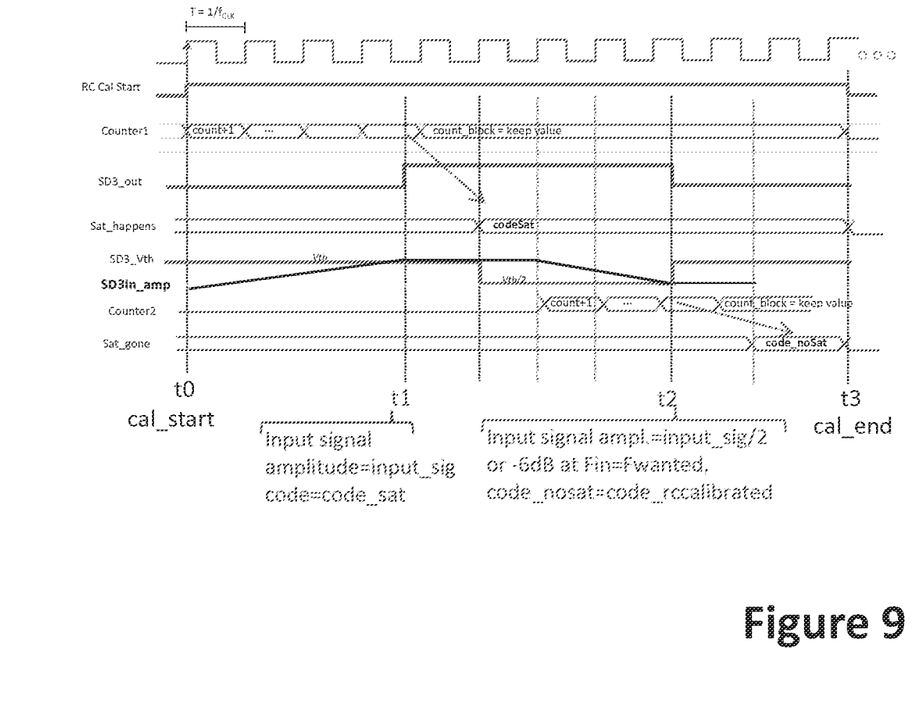
FIG. 9 shows a signal-time diagram to further illustrate the calibration method according to an aspect of the present invention.

Hereinafter, the calibration method according to a further aspect of the present invention will be described by means of the flow diagram in FIG. 8 and the signal-time diagram in FIG. 9:

At a starting point t=t0, the starting levels for calibration are set as follows:
Calibration mode activated: Cal="1" or ON
Counter values of counter 40 and 41 reset
Clock rate: $T=1/f_{CLK}$
DAC activated: en=1
Comparison Voltage: V4=Vth
Setting the desired DAC output frequency to FT
Resistor element 51 activated: S1'="1" or ON
Resistor element 21 activated: S1'="1" or ON
Saturation detector output signal S1="0" or OFF
First, the calibration is activated at X0 (Cal="1").

Second, the output voltage V2 and thus the input voltage V2 of the saturation detector 30 is steadily increased by triggering the resistor 22 with an incrementing counter value CI of the counter 40, thus increasing steadily the resistor value of this resistor 22 (X1).

In X2, the comparator 30 iteratively compares V2 with the comparison voltage V4=Vth as long as these voltage levels V2, V4 are not the same. In this case S1 remains "0" or OFF and the iterations for increasing the resistor values and thus the output voltages V2 continue. If the comparator 30 detects at the point t=t1 that the output voltage V2 corresponds to the comparison voltage V4, saturation is achieved. S1 is switched from "0" to "1".

The counter 40 is stopped and its counter value is blocked (X3). With the next clock T, the code 'codeSat' indicating that saturation has been achieved is stored for example into an internal or external memory.

Then in X4, the comparison voltage V4 is set to the half threshold voltage Vth/2. The resistor element 52 is activated (S1="1" or ON). Consequently the first HP filter 16 takes around half of the desired attenuation, i.e. around −3 dB (or other designed/selected values). This value depends on the natural spread of the first HP filter's 16 RC arrangement, and is actually −3 dB+−spread.

In X5, the output voltage V2 of the HP filter arrangement 11, 16 and thus the input voltage V2 of the saturation detector 30 are steadily decreased by triggering the resistor 23 with a decrementing counter value CD of the counter 41. Thus, the resistor value of this resistor 23 is steadily increasing.

The comparator 30 again iteratively compares V2 with the reduced comparison voltage V4=Vth/2 as long as these voltage levels V2, V4 are not the same (X6). In this case S1 remains "1" or ON and the iterations of decreasing the resistor values and thus the output voltage V2 continue. If the comparator 30 detects at the point t=t2 that the output voltage V2 corresponds to the comparison voltage V4=Vth, saturation has disappeared. S1 is switched from "1" to "0".

The counter 41 is stopped and its counter value is blocked (X7). With the next clock T, the code 'code_noSat' indicating that saturation is no more present is stored. This last code found in X7 is then used to set the R value inside of the second HP filter 11 (FIG. 1) when the integrated circuit or receiver circuit 70 enters in its normal operation mode. This ensures that a −6 dB HP cut-off frequency at the calibrated input frequency is set at the receiver output, or V2 (FIG. 1).

In X8, calibration of the RC arrangement is stopped at t=t3 by setting Cal="0" or OFF which indicates that the calibration is finished.

It may then be possible to proceed with calibration for other test frequencies, input signal amplitudes or the like.

Hereinafter, several other embodiments will be described:

According to a further aspect, the programmable calibration circuit is configured to reduce the comparison voltage by the predetermined value such that at the reduced voltage level the desired cut-off frequency of the frequency response curve of the filter arrangement is reached.

According to a further aspect, the programmable calibration circuit is configured to set the second threshold voltage such that its level is half the level of the level of the first threshold voltage, which represents −6 dB attenuation.

According to a further aspect of the calibration circuit, the tuneable filter is a passive first-order high-pass filter comprising at least two tuneable resistor elements which are arranged in parallel to each other and which are tuneable by applying the incrementing signal to the first resistor element and the decrementing signal to the second resistor element.

According to a further aspect of the calibration circuit, the filter arrangement comprises a chain of at least two filters arranged in series connection to each other, of which the tuneable filter is arranged downstream to at least one further filter, wherein the further filters are configured to be bypassed until saturation of the tuneable filter is detected.

According to a further aspect of the calibration circuit, the saturation detector comprises a controllable voltage setting circuit which is configured to set the comparison voltage to a predetermined value. Preferably, the second threshold voltage is set by reducing the first threshold voltage by the predetermined value. More preferably, the predetermined value itself is settable.

According to a further aspect of the calibration circuit, the calibration control logic comprises a first counter which is configured to increment its counter value and to provide a corresponding incrementing counter signal and/or a second counter which is configured to decrement its counter value and to provide a corresponding decrementing counter signal.

According to a further aspect of the calibration circuit, the calibration control logic comprises a single up/down counter and an up/down selector for controlling the operation of the up/down counter wherein the up/down counter increments its counter value when the up/down selector signalizes an up state and decrements its counter value when the up/down selector signalizes a down state.

According to a further aspect, the calibration circuit further comprises a memory device which is configured to store the actual counter value of the incrementing counter for which saturation was detected and/or to store the actual counter value of the decrementing counter for which non-saturation was detected. This last code found is stored and then further used during normal operation, ensuring a given attenuation level at receiver or circuit output at a given input frequency.

According to a further aspect, the calibration circuit further comprises a DAC which is configured to generate the input signal having the predetermined frequency required for calibration. Preferably, the DAC is programmable in order to produce output signals with a settable frequency.

According to a further aspect, the calibration circuit further comprises at least one amplifier, in particular a variable gain amplifier, which is arranged downstream to a corresponding filter and which is configured to amplify the output signal of this corresponding filter.

According to a further aspect, the integrated circuit is designed to be a receiver circuit comprising at least two filter stages which are connected in series wherein at least two saturation detectors are arranged along the series connection of the filter stages.

According to a further aspect of the integrated circuit, at least one of the filter stages comprises a passive first-order high-pass filter, a variable gain amplifier connected downstream the passive first-order high-pass filter and a saturation detector which is configured to sense the output signal of the variable gain amplifier and to detect its saturation according to a predetermined amplitude level.

According to an aspect of the calibration method, storing the actual incrementing counter value comprises fixing the resistor value of the first tuneable resistor to this incrementing counter value and/or storing the actual decrementing counter value comprises fixing the resistor value of the second tuneable resistor to this decrementing counter value;

According to a further aspect of the calibration method, the second threshold voltage is set such that its value is half the value of the first threshold voltage, which represents a −6 dB attenuation level.

According to a further aspect of the calibration method, the reduction of the comparison voltage by the predetermined value represents a reduced voltage level where the desired cut-off frequency of the frequency response curve of the filter arrangement is reached.

According to a further aspect of the calibration method, saturation and non-saturation is detected by comparing the voltage of the filtered input signal with the first threshold voltage when input signal amplitude is increasing or the second threshold voltage, when input signal amplitude is decreasing, respectively.

According to a further aspect of the calibration method, the filter arrangement comprises at least one further filter connected upstream to the tuneable filter wherein the further filters are bypassed until saturation is detected. "Bypassed" in this context means that this HP-filter basically has no (note worthy) impact on the overall frequency transfer function. After saturation is detected, further filters are connected in order to calibrate their R spread at the same time on the overall calibration procedure or method described herein.

According to a further aspect of the calibration method, the codes representing the stored actual incrementing and decrementing counter values are used during normal operation of the filter arrangement. Using this code found when the saturation disappears to set the R value of second HP filter during receiver normal operation, ensures that the cut-off frequency is at the required level (given by Vth and Vth/2 ratio) and at the required input frequency (FT).

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing the present invention is, for the most part, composed of electronic components and circuits known to those skilled in the art, details of the circuitry and its components will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different circuitry components. For example, the exemplary topology in the figures and the discussion thereof is presented merely to provide a useful reference in discussing various aspects of the invention. Of course, the description of the topology has been simplified for purposes of discussion, and it is just one of many different types of appropriate topologies that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Devices functionally forming separate devices may be integrated in a single physical device.

In the claims, any reference signs placed between parentheses shall not be construed as limiting the claim. The word "comprising" does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The order of method steps as presented in a claim does not prejudice the order in which the steps may actually be carried, unless specifically recited in the claim.

Skilled artisans will appreciate that elements in the figures are illustrated for simplicity and clarity and have not necessarily drawn to scale. For example, the chosen elements are only used to help to improve the understanding of the functionality and the arrangements of these elements in various embodiments of the present invention. Also, common but well understood elements that are useful or necessary in a commercial feasible embodiment are mostly not depicted in order to facilitate a less abstracted view of these various embodiments of the present invention. It will further be appreciated that certain actions and/or steps in the described method may be described or depicted in a particular order of occurrences while those skilled in the art will understand that such specificity with respect to sequence is not actually required. It will also be understood that the terms and expressions used in the present specification have the ordinary meaning as it accorded to such terms and expressions with respect to their corresponding respective areas of inquiry and study except where specific meanings have otherwise be set forth herein.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

Each signal described herein may be designed as positive or negative logic, where negative logic can be indicated by a bar over the signal name or a dash (') or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Other modifications, variations and alternatives are also possible. The specifications and drawings are, accordingly, to be regarded in an illustrative rather than in a restrictive sense.

LIST OF USED REFERENCE SYMBOLS 10 calibration circuit
11 filter circuit, second high-pass filter
12 saturation detector
13 calibration control logic
14 internal calibration input terminal
15 output terminal
16 filter circuit, first high-pass filter
17 tap
20 capacitor element 21-23 switchable resistor elements
24 reference terminal
30 analogue comparator, operational amplifier
31, 32 terminals
33 digital output terminal
34 voltage generator
35, 36 switchable resistor elements
37 current source
40 first counter, incrementing counter
41 second counter, decrementing counter
42 timer unit
43 memory unit
44 up/down counter
45 clock input terminal
50 capacitor element
51, 52 switchable resistor elements
53 reference terminal
70 integrated circuit, receiver circuit
71 input terminal
72 output terminal
73 mixer
74, 75 high-pass filter/amplifier stages
74$a$,75$a$ high-pass filter
74$b$,75$b$ variable gain amplifier, VGA
76-78 saturation detectors
79, 80 tap
81 digital-to-analogue converter, D/A-converter, DAC
82 printed circuit board, PCB
83 calibration control logic
84 microcontroller
84 loads
Cal calibration enable signal
CD decrementing counter signal
CI incrementing counter signal
CLK clock signal
en DAC activation signal
FRF high-frequency signal
FIF intermediated frequency signal
FT sinus signal
I Current of the current source
S1, S1' saturation status signals
S2 comparator output signal
t time-axis
t0-t3 time points
T clock period
V1 calibration signal
V2 output signal
V3 tap voltage
VB1,VB2 reference voltages
Vcm Common mode voltage
Vth, Vth/2 threshold voltages
X0-X8 steps

The invention claimed is:

1. A calibration circuit for calibrating a RC circuit of an integrated circuit the calibration circuit comprising:
 a filter arrangement comprising at least one tuneable filter configured to filter an input signal having a predetermined frequency wherein the tuneable filter comprises at least two tuneable resistor elements;
 a saturation detector configured to detect saturation and non-saturation of the tuneable filter by comparing a comparison voltage with the signal voltage of the filtered input signal;
 a calibration control logic configured to provide an incrementing counter signal and a decrementing counter signal;
 wherein the calibration circuit is further configured to:
  set the comparison voltage to a first threshold voltage;
  provide iteratively an incrementing counter signal to the tuneable filter until saturation is detected;
  after saturation is detected, reducing the comparison voltage to a predetermined second threshold voltage which is by a predetermined value lower than the first threshold voltage; and
  provide then iteratively a decrementing counter signal to the tuneable filter until non-saturation is detected.

2. The calibration circuit of claim 1, wherein the programmable calibration circuit is configured to reduce the comparison voltage by the predetermined value such that after reduction the comparison voltage has a reduced voltage level which represents the desired cutoff frequency of the frequency response curve of the filter arrangement.

3. The calibration circuit of claim 1, wherein the programmable calibration circuit is configured to set the second threshold voltage such that its level is half the level of the first threshold voltage, which represents −6 dB attenuation.

4. The calibration circuit of claim 1, wherein the tuneable filter is a first-order high-pass filter comprising at least two tuneable resistor elements which are arranged in parallel to each other and which are tuneable by applying the incrementing counter signal to the first resistor element and the decrementing counter signal to the second resistor element.

5. The calibration circuit of claim 1, wherein the filter arrangement comprises a chain of at least two filters arranged in series connection to each other, of which the tuneable filter is arranged downstream to at least one further filter, wherein the further filters are configured to be bypassed until saturation of the tuneable filter is detected.

6. The calibration circuit of claim 1, wherein the saturation detector comprises a controllable voltage setting circuit which is configured to set the comparison voltage to a predetermined value.

7. The calibration circuit of claim 1, wherein the calibration control logic comprises an incrementing counter which is configured to increment its counter value and to provide a corresponding incrementing counter signal or a decrementing counter which is configured to decrement its counter value and to provide a corresponding decrementing counter signal.

8. The calibration circuit of claim 1, wherein the calibration control logic comprises a single up/down counter and an up/down selector for controlling the operation of the up/down counter wherein the up/down counter increments its counter value when the up/down selector signalizes an up state and decrements its counter value when the up/down selector signalizes a down state.

9. The calibration circuit of claim 1, further comprising a memory device which is configured to store the actual counter value of the incrementing counter for which saturation was detected or to store the actual counter value of the decrementing counter for which non-saturation was detected.

10. The calibration circuit of claim 1, further comprising a DAC which is configured to generate the input signal having the predetermined frequency required for calibration.

11. The calibration circuit of claim 1, further comprising at least one amplifier, each of which are arranged downstream to a corresponding filter of the filter arrangement and each of which are configured to amplify the output signals of the corresponding filters.

12. An integrated circuit, comprising:
 a frequency mixer configured to shift an input signal from a high frequency range to an intermediate frequency range;

a baseband circuit arranged downstream to the frequency mixer and comprising at least one filter stage; and at least one calibration circuit, wherein the calibration circuit employs at least one filter stage of the baseband circuit for calibration, the calibration circuit comprising:

a filter arrangement comprising at least one tunable filter configured to filter an input signal having a predetermined frequency wherein the tuneable filter comprises at least two tuneable resistor elements;

a saturation detector configured to detect saturation and non-saturation of the tuneable filter by comparing a comparison voltage with the signal voltage of the filtered input signal;

a calibration control logic configured to provide an incrementing counter signal and a decrementing counter signal, wherein the calibration circuit is further configured to set the comparison voltage to a first threshold voltage, provide iteratively an incrementing counter signal to the tuneable filter until saturation is detected, after saturation is detected, reducing the comparison voltage to a predetermined second threshold voltage which is by a predetermined value lower than the first threshold voltage, and provide then iteratively a decrementing counter signal to the tuneable filter until non-satureation is detected.

13. The integrated circuit of claim 12, wherein the integrated circuit is a receiver circuit comprising at least two filter stages which are connected in series connection to each other wherein at least two saturation detectors are arranged along the series connection of the filter stages.

14. The integrated circuit of claim 12, wherein at least one of the filter stages comprises:

a first-order high-pass filter;

a variable gain amplifier connected downstream from the first-order high-pass filter; and a saturation detector which is configured to sense the output signal of the corresponding variable gain amplifier and to detect its saturation according to a predetermined amplitude level.

15. The integrated circuit of claim 12, wherein the receiver circuit is included within an automotive radar system, and the automotive radar system further includes a transmitter circuit for transmitting signals, a frequency synthesizer circuit for providing a desired operating frequency, and a microcontroller circuit.

16. A built in self-test calibration method for calibrating a filter arrangement having a tuneable filter, in particular by employing a calibration circuit , the method comprising:

setting a comparison voltage at a saturation detector to a first threshold voltage;

providing an input signal having a predetermined frequency to the tuneable filter;

iteratively providing an incrementing counter signal to a first tuneable resistor element of the tuneable filter until saturation is detected;

storing the actual incrementing counter value for which saturation was detected;

setting the comparison voltage to a predetermined second threshold voltage;

iteratively providing a decrementing counter signal to a second tuneable resistor element of the tuneable filter until non-saturation is reached; and storing the actual decrementing counter value for which non-saturation was detected.

17. The method of claim 16, wherein storing the actual incrementing counter value comprises fixing the resistor value of the first tuneable resistor element to this incrementing counter value and/or wherein storing the actual decrementing counter value comprises fixing the resistor value of the second tuneable resistor element to this decrementing counter value.

18. The method of claim 16, wherein the second threshold voltage is set such that its voltage level is half the level of the first threshold voltage, which represents −6 dB attenuation.

19. The method of claim 16, wherein the reduction of the comparison voltage by the predetermined value represents a reduced voltage level where the desired cutoff frequency of the frequency response curve of the filter arrangement is reached.

20. The method of claim 16, wherein saturation and non-saturation is detected by comparing the voltage level of the filtered input signal with the first threshold voltage or the second threshold voltage, respectively.

* * * * *